United States Patent
Sakai et al.

(10) Patent No.: US 6,803,121 B2
(45) Date of Patent: Oct. 12, 2004

(54) ORGANIC ELECTROLUMINESCENCE DEVICE

(75) Inventors: Toshio Sakai, Chiba (JP); Kenichi Fukuoka, Chiba (JP); Hiroshi Tokairin, Chiba (JP); Chishio Hosokawa, Chiba (JP)

(73) Assignee: Idemitsu Kosan Co., Ltd. (JP)

( * ) Notice: Subject to any disclaimer, the term of this patent is extended or adjusted under 35 U.S.C. 154(b) by 26 days.

(21) Appl. No.: 09/993,660

(22) Filed: Nov. 27, 2001

(65) Prior Publication Data

US 2002/0136922 A1 Sep. 26, 2002

(30) Foreign Application Priority Data

Nov. 27, 2000 (JP) ........................................ 2000-359177

(51) Int. Cl.$^7$ .............................................. H05B 33/14
(52) U.S. Cl. ....................... 428/690; 428/917; 313/504; 313/506; 257/40; 257/102; 257/103
(58) Field of Search ................................ 428/690, 917; 313/504, 506; 257/40, 102, 103

(56) References Cited

U.S. PATENT DOCUMENTS 5,536,949 A * 7/1996 Hosokawa et al. ........... 257/40
5,635,308 A * 6/1997 Inoue et al. ................. 428/690

FOREIGN PATENT DOCUMENTS

EP   0 836 366 A1 *  4/1998

* cited by examiner

*Primary Examiner*—Marie Yamnitzky
(74) *Attorney, Agent, or Firm*—Parkhurst & Wendel, L.L.P.

(57) ABSTRACT

An organic electroluminescence device which comprises a pair of electrodes comprising an anode and a cathode and a layer of organic compounds comprising at least an organic light emitting layer and disposed between the pair of electrodes, wherein the layer of organic compounds comprises a light emitting material and a bis-condensed aromatic cyclic compound. The organic electroluminescence device exhibits suppressed crystallization in driving for a long time or in environments at high temperatures, has improved durability and is advantageously used in practical applications.

6 Claims, No Drawings

ORGANIC ELECTROLUMINESCENCE DEVICE

TECHNICAL FIELD

The present invention relates to an organic electroluminescence device (hereinafter, "electroluminescence" will be referred to as EL) and, more particularly, to an organic EL device exhibiting suppressed crystallization in driving for a long time or in environments at high temperatures, having improved durability and advantageously used in practical applications.

BACKGROUND ART

EL devices which utilize light emission under application of an electric field show high self-distinguishability due to the self-emission and exhibit excellent impact resistance because they are completely solid devices. Therefore, EL devices have been attracting attention for application as light emitting devices in various types of display apparatus.

The EL devices include inorganic EL devices in which an inorganic compound is used as the light emitting material and organic EL devices in which an organic compound is used as the light emitting material. Organic EL devices have been extensively studied for practical application as a light emitting device of the next generation because the applied voltage can be decreased to a great extent, the size of the device can be reduced easily, consumption of electric power is small, planar light emission is possible and three primary colors are easily emitted.

As for the construction of the organic EL device, the basic construction comprises an anode/an organic light emitting layer/a cathode. Constructions having a hole injecting and transporting layer or an electron injecting layer suitably added to the basic construction are known. Examples of such constructions include the construction of an anode/a hole injecting and transporting layer/an organic light emitting layer/a cathode and the construction of an anode/a hole injecting and transporting layer/an organic light emitting layer/an electron injecting layer/a cathode.

In practical application of organic EL devices, stability in driving for a long time and driving stability and storage stability in environments at high temperatures such as outdoors and in automobiles are required. A great problem under such circumstances is in that materials constituting a device crystallize under the above environment and uniformity of light emission of the device is adversely affected. When a device is driven for a long time, the materials constituting the device is subjected to a great thermal change due to the elevation of the temperature caused by the heat generated by the device itself and the change in the environment at the outside. It is known that organic compounds are crystallized due to the thermal change. The crystallization causes short circuits and formation of defects and gives rise not only to deterioration in the uniformity of the light emitting surface but also to failure in the light emission, occasionally. Therefore, studies on technology to suppress the crystallization have been made.

As the method for suppressing crystallization, for example, improvement in heat resistance of materials constituting a device, specifically, by elevation of the glass transition temperature has been attempted (Japanese Patent Application Laid-Open No. Heisei 10(1998)-110163). However, the above method has drawbacks in that synthesis of the material becomes very difficult and cost of the material increases and that, when the improvement in heat resistance is emphasized, the material has difficulty in purification since the material is not easily soluble in solvents due to an increased molecular weight of the compound and the performance of the EL device deteriorates.

A device having an improved storage property at high temperatures by adding a substance for suppressing crystallization to the light emitting material is disclosed in Japanese Patent Application Laid-Open No. 2000-208264. The durability of this device in driving at a temperature higher than 85° C. has to be improved although crystallization can be suppressed when the device is kept at 85° C. or lower.

DISCLOSURE OF THE INVENTION

Under the above circumstances, the present has an object of providing an organic EL device exhibiting suppressed crystallization in driving for a long time or in environments at high temperatures, has improved durability and is advantageously used in practical applications.

As the result of extensive studies by the present inventors to achieve the above object, it was found that crystallization was suppressed in driving the device for a long time or in environments at higher temperatures and a device having improved durability could be obtained when, in an organic electroluminescence device which comprises a pair of electrodes comprising an anode and a cathode and a layer of organic compounds comprising at least an organic light emitting layer and disposed between the pair of electrodes, the layer of organic compounds comprised a light emitting material and a bis-condensed aromatic cyclic compound. The present invention has been completed based on the above knowledge.

The present invention provides an organic electroluminescence device which comprises a pair of electrodes comprising an anode and a cathode and a layer of organic compounds comprising at least an organic light emitting layer and disposed between the pair of electrodes, wherein the layer of organic compounds comprises a light emitting material and a bis-condensed aromatic cyclic compound.

THE MOST PREFERRED EMBODIMENT TO CARRY OUT THE INVENTION

The organic electroluminescence device of the present invention comprises a pair of electrodes comprising an anode and a cathode and a layer of organic compounds comprising at least an organic light emitting layer and disposed between the pair of electrodes, wherein the layer of organic compounds comprises a light emitting material and a bis-condensed aromatic cyclic compound.

It is preferable that the light emitting material is a compound represented by following general formula (1):

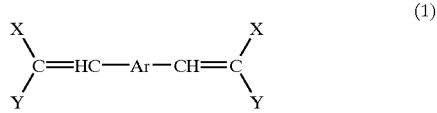

(1)

wherein X and Y each independently represent a substituted or unsubstituted aryl group having 6 to 50 carbon atoms or a substituted or unsubstituted monovalent heterocyclic group having 3 to 50 carbon atoms and may represent the same group or different groups and Ar represents an arylene group having 6 to 80 carbon atoms, a polyarylene group, a divalent triphenylamine residue group, a divalent heterocyclic group having 3 to 80 carbon atoms or a divalent group formed by bonding these groups to each other.

Examples of the substituent in the groups represented by X and Y in above general formula (1) include halogen atoms, cyano group, nitro group, alkyl groups, alkoxyl groups, aryloxyl groups, alkylthio group, arylthio groups, arylalkyl groups, monocyclic groups, condensed polycyclic groups, arylsilyl groups, heterocyclic groups and alkenyl groups.

The compound represented by general formula (1) may be used singly or in combination of two or more.

The bis-condensed aromatic cyclic compound described above is a material which suppresses crystallization in the light emitting layer without adverse effects on the light emitting property of the device and improves the properties in driving at high temperatures and the storage property by mixing the material into the light emitting layer. The bis-condensed aromatic cyclic compound is suitable as the material for this purpose.

The above bis-condensed aromatic cyclic compound is a compound formed by linking at least two condensed aromatic rings to each other through a linking group or a single bond. As the condensed aromatic ring, cyclic structures of naphthalene, anthracene, fluorene, perylene, pyrene, phenanthrene, chrysene, tetracene, rubrene, pentacene, triphenylene, rubicene, pycene, coronene and fluoranthene are preferable and cyclic structures of anthracene, fluorene, perylene, pyrene, phenanthrene and fluoranthene are more preferable. As the linking group, hydrocarbon groups and heterocyclic groups are preferable. As the hydrocarbon group, arylene groups are preferable. In particular, bisanthracene compound is preferable as the bis-condensed aromatic cyclic compound used in the present invention.

In the bis-condensed aromatic cyclic compound, the plane of one aromatic ring is twisted relative to the plane of the other aromatic ring. Since the angle between the planes is not fixed to a specific value, the compound takes no specific stable configuration with the molecule of the light emitting material. Therefore, when the molecules of the light emitting material move so as to be arranged in a specific manner, the compound exhibits a great effect of suppressing the movement. Since the angle between the planes of the rings in the bis-condensed aromatic cyclic compound is not fixed to a specific value, the molecules of the compound are not arranged in a specific manner and crystallization does not take place.

As the bis-condensed aromatic cyclic compound, a compound represented by the following general formula (2) or general formula (3) is preferable:

General formula (2):

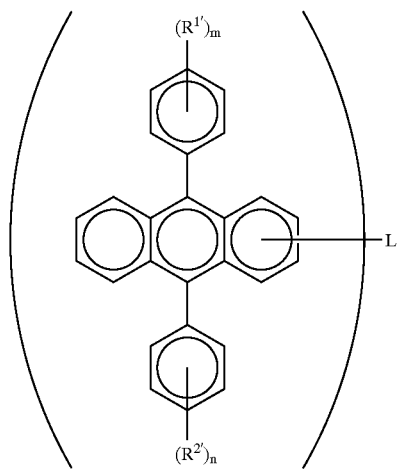

wherein $R^{1'}$ and $R^{2'}$ each independently represent a substituted or unsubstituted alkyl group having 1 to 30 carbon atoms, a substituted or unsubstituted cycloalkyl group having 5 to 30 carbon atoms, a substituted or unsubstituted aryl group having 6 to 30 carbon atoms, a substituted or unsubstituted alkenyl group having 3 to 30 carbon atoms, a substituted or unsubstituted alkoxyl group having 1 to 30 carbon atoms, a substituted or unsubstituted aryloxyl group having 6 to 30 carbon atoms, a substituted or unsubstituted amino group or a substituted or unsubstituted heterocyclic group having 2 to 30 carbon atoms and may represent a same group or different groups;

n and m each represent an integer of 0 to 5, when n represents an integer of 2 or greater, a plurality of $R^{1'}$ may represent the same group or different groups and may be bonded to each other to form a cyclic structure and, when m represents an integer of 2 or greater, a plurality of $R^{2'}$ may represent the same group or different groups and may be bonded to each other to form a cyclic structure; and L represents a single bond, a substituted or unsubstituted arylene group having 6 to 30 carbon atoms, a substituted or unsubstituted alkylene group having 1 to 30 carbon atoms, —O—, —S— or —NR—, R representing a substituted or unsubstituted alkyl group having 1 to 30 carbon atoms or a substituted or unsubstituted aryl group having 6 to 30 carbon atoms.

General formula (3):

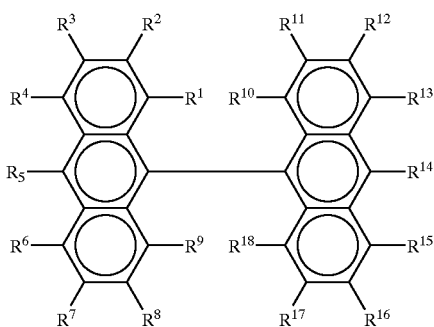

wherein $R^1$ and $R^{18}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted cycloalkyl group having 5 to 30 carbon atoms, a substituted or unsubstituted alkenyl group having 3 to 30 carbon atoms, a substituted or unsubstituted alkoxyl group having 1 to 30 carbon atoms, a substituted or unsubstituted aromatic hydrocarbon group having 6 to 30 carbon atoms, a substituted or unsubstituted aromatic heterocyclic group having 2 to 30 carbon atoms, a substituted or unsubstituted aralkyl group having 7 to 30 carbon atoms, a substituted or unsubstituted aryloxyl group having 6 to 30 carbon atoms, a substituted or unsubstituted alkoxycarbonyl group having 1 to 30 carbon atoms or carboxyl group.

Examples of the substituent in the groups in above general formulae (2) and (3) include halogen atoms, cyano group, nitro group, alkyl groups, alkoxyl groups, aryloxyl groups, alkylthio group, arylthio groups, arylalkyl groups, monocyclic groups, condensed polycyclic groups, arylsilyl groups, heterocyclic groups and alkenyl groups.

When the bis-condensed aromatic cyclic compound used in the present invention is comprised in the layer of organic compounds, the electric properties such as the driving voltage and the efficiency of light emission or the life of the device should not be affected by the bis-condensed aromatic cyclic compound but should remain the same as those of a device which does not comprise the compound. The bis-condensed aromatic cyclic compound is used to suppress crystallization in the device which may take place in driving for a long time or under change in the thermal environment. Therefore, it is preferable that the energy gap of the bis-condensed aromatic cyclic compound is the same as or greater than the energy gap of the light emitting material in the organic light emitting layer so that the bis-condensed aromatic cyclic compound does not take part in the recombination of electrons and holes or in the formation of the excited state. It is also preferable that the bis-condensed aromatic cyclic compound is a compound inactive to other compounds present in the organic light emitting layer. It is possible that the bis-condensed aromatic cyclic compound works supplementary for the electron transport and the hole transport.

When the bis-condensed aromatic cyclic compound is the compound represented by above general formula (2) and the light emitting material is the compound represented by above general formula (1), it is preferable that the energy gap of the compound represented by general formula (2) is greater than the energy gap of the compound represented by general formula (1).

Examples of the bis-condensed aromatic cyclic compound include compounds having structures represented by general formulae (4) to (6) shown in the following.

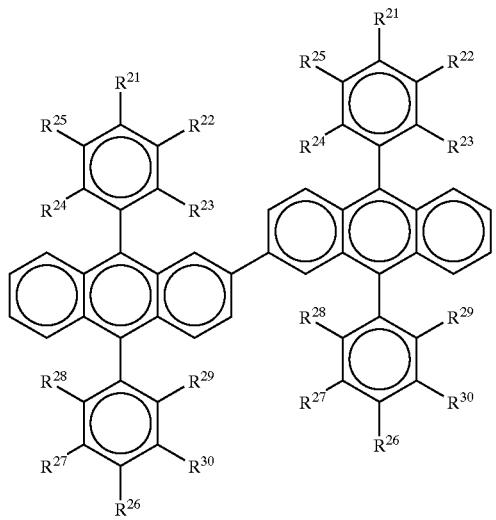

(4)

Examples of combinations of $R^{21}$ to $R^{30}$ in general formula (4) are shown in the following:

| Compound No. | $R^{21}$ | $R^{22}$ | $R^{23}$ | $R^{24}$ | $R^{25}$ | $R^{26}$ | $R^{27}$ | $R^{28}$ | $R^{29}$ | $R^{30}$ |
|---|---|---|---|---|---|---|---|---|---|---|
| (4-1) | H | H | H | H | H | H | H | H | H | H |
| (4-2) | CH₃ | H | H | H | H | CH₃ | H | H | H | H |
| (4-3) | t-C₄H₉ | H | H | H | H | t-C₄H₉ | H | H | H | H |
| (4-4) | OCH₃ | H | H | H | H | OCH₃ | H | H | H | H |
| (4-5) | OPh | H | H | H | H | OPh | H | H | H | H |
| (4-6) | N(C₂H₅)₂ | H | H | H | H | N(C₂H₅)₂ | H | H | H | H |
| (4-7) | N(Ph)₂ | H | H | H | H | N(Ph)₂ | H | H | H | H |
| (4-8) | Ph | H | H | H | H | Ph | H | H | H | H |
| (4-9) | —C₆H₄—CH₃ | H | H | H | H | —C₆H₄—CH₃ | H | H | H | H |
| (4-10) | H | CH₃ | H | H | H | H | CH₃ | H | H | H |
| (4-11) | H | CH₃ | H | CH₃ | H | H | CH₃ | H | CH₃ | H |
| (4-12) | H | H | CH₃ | H | H | H | H | CH₃ | H | H |
| (4-13) | H | CH₃ | H | H | CH₃ | H | CH₃ | H | H | CH₃ |
| (4-14) | CH₃ | CH₃ | CH₃ | CH₃ | CH₃ | CH₃ | CH₃ | CH₃ | CH₃ | CH₃ |
| (4-15) | t-C₄H₉ | H | H | H | H | H | H | H | H | H |
| (4-16) | —C₆H₄—C₆H₅ | H | H | H | H | —C₆H₄—C₆H₅ | H | H | H | H |
| (4-17) | H | Ph | H | H | H | H | Ph | H | H | H |
| (4-18) | H | H | Ph | H | H | H | H | Ph | H | H |

-continued

| Compound No. | R²¹ | R²² | R²³ | R²⁴ | R²⁵ | R²⁶ | R²⁷ | R²⁸ | R²⁹ | R³⁰ |
|---|---|---|---|---|---|---|---|---|---|---|
| (4-19) | C(Ph)=C(Ph)(Ph) with CH₃ | H | H | H | H | C(Ph)=C(Ph)(Ph) with CH₃ | H | H | H | H |
| (4-20) | n-C₄H₉ | H | H | H | H | n-C₄H₉ | H | H | H | H |

* Ph: Phenyl group

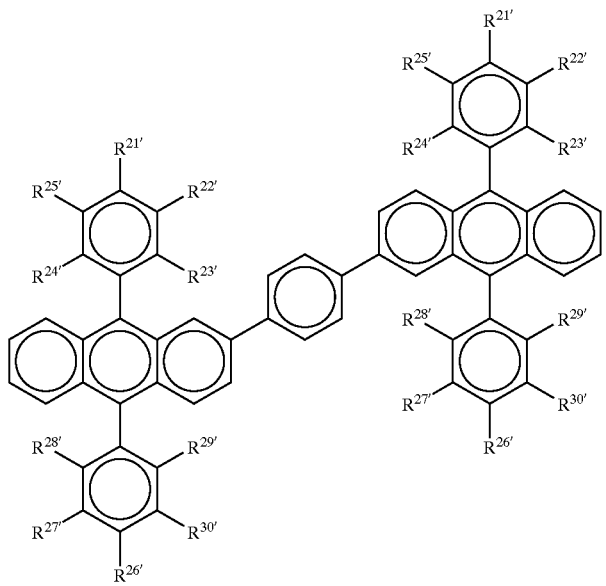

(5)

Examples of combinations of $R^{21'}$ to $R^{30'}$ in general formula (5) are shown in the following:

| Compound No. | R²¹' | R²²' | R²³' | R²⁴' | R²⁵' | R²⁶' | R²⁷' | R²⁸' | R²⁹' | R³⁰' |
|---|---|---|---|---|---|---|---|---|---|---|
| (5-1) | H | H | H | H | H | H | H | H | H | H |
| (5-2) | CH₃ | H | H | H | H | CH₃ | H | H | H | H |
| (5-3) | t-C₄H₉ | H | H | H | H | t-C₄H₉ | H | H | H | H |
| (5-4) | OCH₃ | H | H | H | H | OCH₃ | H | H | H | H |
| (5-5) | OPh | H | H | H | H | OPh | H | H | H | H |
| (5-6) | N(C₂H₅)₂ | H | H | H | H | N(C₂H₅)₂ | H | H | H | H |
| (5-7) | N(Ph)₂ | H | H | H | H | N(Ph)₂ | H | H | H | H |
| (5-8) | Ph | H | H | H | H | Ph | H | H | H | H |
| (5-9) | -C₆H₄-CH₃ | H | H | H | H | -C₆H₄-CH₃ | H | H | H | H |
| (5-10) | H | CH₃ | H | H | H | H | CH₃ | H | H | H |
| (5-11) | H | H | CH₃ | H | H | H | H | CH₃ | H | H |
| (5-12) | H | H | CH₃ | CH₃ | H | H | H | CH₃ | CH₃ | H |
| (5-13) | H | H | CH₃ | H | CH₃ | H | H | CH₃ | H | CH₃ |
| (5-14) | CH₃ | CH₃ | CH₃ | CH₃ | CH₃ | CH₃ | CH₃ | CH₃ | CH₃ | CH₃ |
| (5-15) | H | Ph | H | H | H | H | Ph | H | H | H |
| (5-16) | H | H | Ph | H | H | H | H | Ph | H | H |

-continued

| Compound No. | $R^{21'}$ | $R^{22'}$ | $R^{23'}$ | $R^{24'}$ | $R^{25'}$ | $R^{26'}$ | | $R^{27'}$ | $R^{28'}$ | $R^{29'}$ | $R^{30'}$ |
|---|---|---|---|---|---|---|---|---|---|---|---|
| (5-17) | -biphenyl- | H | H | H | H | | -biphenyl- | H | H | H | H |
| (5-18) | $t\text{-}C_4H_9$ | H | H | H | H | H | | H | H | H | H |
| (5-19) | -cyclohexyl- | H | H | H | H | | -cyclohexyl- | H | H | H | H |
| (5-20) | -oxadiazole-Ph | H | H | H | H | | -oxadiazole-Ph | H | H | H | H |

* Ph: Phenyl group

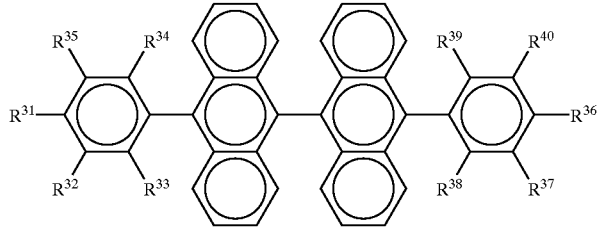

(6)

Examples of combinations of $R^{31}$ to $R^{40}$ in general formula (6) are shown in the following:

| Compound No. | $R^{31}$ | $R^{32}$ | $R^{33}$ | $R^{34}$ | $R^{35}$ | $R^{36}$ | $R^{37}$ | $R^{38}$ | $R^{39}$ | $R^{40}$ |
|---|---|---|---|---|---|---|---|---|---|---|
| (6-1) | H | H | H | H | H | H | H | H | H | H |
| (6-2) | $CH_3$ | H | H | H | H | $CH_3$ | H | H | H | H |
| (6-3) | $t\text{-}C_4H_9$ | H | H | H | H | $t\text{-}C_4H_9$ | H | H | H | H |
| (6-4) | $OCH_3$ | H | H | H | H | $OCH_3$ | H | H | H | H |
| (6-5) | OPh | H | H | H | H | OPh | H | H | H | H |
| (6-6) | $N(C_2H_5)_2$ | H | H | H | H | $N(C_2H_5)_2$ | H | H | H | H |
| (6-7) | $N(Ph)_2$ | H | H | H | H | $N(Ph)_2$ | H | H | H | H |
| (6-8) | Ph | H | H | H | H | Ph | H | H | H | H |
| (6-9) | -C$_6$H$_4$-CH$_3$ | H | H | H | H | -C$_6$H$_4$-CH$_3$ | H | H | H | H |
| (6-10) | H | H | $CH_3$ | $CH_3$ | H | H | H | $CH_3$ | $CH_3$ | H |
| (6-11) | H | H | $CH_3$ | H | $CH_3$ | H | H | $CH_3$ | H | $CH_3$ |
| (6-12) | H | $CH_3$ | H | H | H | H | $CH_3$ | H | H | H |
| (6-13) | H | H | $CH_3$ | H | H | H | H | $CH_3$ | H | H |
| (6-14) | $CH_3$ | $CH_3$ | $CH_3$ | $CH_3$ | $CH_3$ | $CH_3$ | $CH_3$ | $CH_3$ | $CH_3$ | $CH_3$ |

* Ph: Phenyl group

In the organic EL device of the present invention, it is preferable that the ratio of the amount by weight of the light emitting material to the amount by weight of the bis-condensed aromatic cyclic compound in the layer of organic compounds is in the range of 100:1 to 40:60 since the crystallization of the layer of organic compounds can be efficiently suppressed in driving the device for a long time or under change in the thermal environment without influence on the electric properties or the life of the device.

It is advantageous that the layer of organic compounds comprising the light emitting material and the bis-condensed aromatic cyclic compound in the above relative amounts is formed in accordance with the following process. The light emitting material and the bis-condensed aromatic cyclic compound are placed into separate boats for the source of vapor deposition and the vapor deposition is conducted while the relative rates of vapor deposition of the components are adjusted. Alternatively, the light emitting material and the bis-condensed aromatic cyclic compound are placed into the same boat for the source of vapor deposition in suitably adjusted relative amounts and the vapor deposition is conducted so that the layer of organic compounds comprising the light emitting material and the bis-condensed aromatic cyclic compound in the above relative amounts can be formed.

When the light emitting layer comprises the light emitting material and the bis-condensed aromatic cyclic compound, it is preferable that the film has a thickness of 5 nm to 0.5 µm since a device which exhibits a high efficiency and can be used under a low voltage is obtained.

The light emitting layer may further comprise a fluorescent molecule. Preferable examples of the fluorescent molecule include derivatives of styrylamine, distyrylamine, distyrylarylenes, coumarine, quinacridone, perylene, naphthacene and fluoranthene. By adding the fluorescent molecule into the light emitting layer, the organic EL device having a higher efficiency of light emission and a longer life can be obtained. More preferable examples of the fluorescent molecule include fluorescent molecules having a smaller energy gap than that of the light emitting material comprised in the light emitting layer, such as distyrylarylene derivatives.

The light emitting layer in the organic EL device of the present invention has the following functions: (1) the injecting function which is the function of injecting holes from the anode or the hole injecting and transporting layer and injecting electrons from the cathode or the electron injecting layer when an electric field is applied; (2) the transporting function which is the function of transporting injected charges (electrons and holes) by the force of the electric field; and (3) the light emitting function which is the function of providing the field for recombination of electrons and holes and leading the recombination to the emission of light.

The easiness of the injection of holes may be different from the easiness of the injection of electrons and the ability of transportation expressed as the mobility may be different between the holes and the electrons. It is preferable that either holes or electrons are transported.

Since the light emitting material used in the light emitting layer has, in general, an ionization energy smaller than about 6.0 eV, holes are relatively easily injected when a suitable anode metal or anode compound is selected. Since the light emitting material has an electron affinity greater than about 2.8 eV, electrons are relatively easily injected and excellent transporting ability of holes and electrons is exhibited when a suitable cathode metal or cathode compound is selected. Moreover, since the fluorescent property in the solid state is strongly exhibited, association products and crystals of the compounds have great ability to convert the excited state formed by recombination of electrons and holes into light.

As the construction of the organic EL device of the present invention, various constructions may be used. The basic construction has a pair of electrodes (an anode and a cathode) and at least a layer of organic compounds disposed between the pair of electrodes. Where necessary, a hole injecting and transporting layer and an electron injecting layer may be further disposed in the layer of organic compounds. These layers may be formed by mixing into a polymer or by simultaneous vapor deposition. Examples of the construction of layers include (1) an anode/a light emitting layer/a cathode; (2) an anode/a hole injecting and transporting layer/a light emitting layer/a cathode; (3) an anode/a hole injecting and transporting layer/a light emitting layer/an electron injecting layer/a cathode; and (4) an anode/a light emitting layer/an electron injecting layer/a cathode. Although the hole injecting and transporting layer and the electron injecting layer are not essential, these layers can improve the light emitting property.

It is preferable that the device having the above construction is supported on a substrate. The substrate is not particularly limited and a substrate conventionally used for EL devices such as a glass substrate, a transparent plastic substrate and a quartz substrate can be used.

As the anode in the organic EL device, an electrode made of a material such as a metal, an alloy, a conductive compound and a mixture of these materials which has a great work function (4 eV or more) is preferably used. Specific examples of the material for the anode include metals such as Au and transparent dielectric materials such as CuI, ITO (indium tin oxide), $SnO_2$ and ZnO. The anode can be prepared by forming a thin film of the electrode material described above in accordance with a process such as the vapor deposition process and the sputtering process. When the light emitted from the light emitting layer is obtained through the anode, it is preferable that the anode has a transmittance of the emitted light greater than 10%. It is also preferable that the sheet resistivity of the anode is several hundred $\Omega/\square$ or smaller.

The thickness of the anode is, in general, selected in the range of 10 nm to 1 µm and preferably in the range of 10 to 200 nm although the preferable range may be different depending on the used material.

As the cathode, an electrode made of a material such as a metal, an alloy, a conductive compound and a mixture of these materials which has a small work function (4 eV or smaller) is used. Specific examples of the material for the cathode include sodium, sodium-potassium alloys, magnesium, lithium, magnesium-copper mixtures, $Al/Al_2O_3$ and indium. The cathode can be prepared by forming a thin film of the material described above in accordance with a process such as the vapor deposition process and the sputtering process. It is also preferable that the sheet resistivity of the cathode is several hundred $\Omega/\square$ or smaller. The thickness of the cathode is selected, in general, in the range of 10 nm to 1 µm and preferably in the range of 50 to 200 nm. It is preferable that any one of the anode and the cathode in the organic EL device of the present invention is transparent or translucent since the emitted light can be transmitted and obtained at an excellent efficiency.

It is preferable that a layer of an inorganic compound is disposed between the layer of organic compounds and the cathode or an inorganic compound is mixed into the layer of organic compounds at a portion close to the cathode since the efficiency of the light emission and the life are further improved. It is preferable that the inorganic compound is at least one compound selected from alkali metal oxides, alkali metal halides, alkaline earth metal oxides, alkaline earth metal halides, rare earth metal oxides, rare earth metal halides and organic complexes of alkali metals. It is preferable that the inorganic compound is introduced in the form of a layer or islands. When the inorganic compound is introduced in the form of a layer, it is preferable that the layer is formed with an alkaline earth metal oxide, an alkali metal oxide or an alkali metal fluoride having the electron injecting property and is an ultrathin film having a thickness of 0.1 to 10 nm. Examples of the alkaline earth metal oxide include BaO, SrO, CaO and $Ba_xSr_{1-x}O$ (0<x<1) and $Ba_xCa_{1-x}O$ (0<x<1) which are obtained by mixing the above oxides. Examples of the alkali metal oxide and the alkali metal fluoride include LiF, Li$_2$O and NaF. As the process for forming the layer of an alkaline earth metal oxide, it is preferable that oxygen is introduced into an evacuated vessel under a vacuum adjusted to $10^{-3}$ to $10^{-4}$ Pa while the alkaline earth metal is vapor deposited in accordance with the vapor deposition process using resistance heating and the reaction of the alkaline earth metal with oxygen and deposition of the resultant oxide are simultaneously conducted. The layer of an alkaline earth metal oxide can also be formed in accordance with the vapor deposition process using electron beams. As the process for forming the layer of an alkali metal oxide, the same process as that used for forming the layer of an alkaline earth metal oxide described above can be used. As the process for forming the layer of an alkali metal fluoride, the vapor deposition process using electron beams or the vapor deposition process using resistance heating can be used.

Embodiments of the process for preparing an organic EL device will be described with respect to the devices having various constructions. When the organic EL device has the construction of an anode/a light emitting layer/a cathode, a thin film made of a desired electrode material such as a material for the anode is formed on a suitable substrate in accordance with the vapor deposition process or the sputtering process so that the thickness of the formed thin film is 1 μm or smaller and preferably in the range of 10 to 200 nm. The formed thin film is used as the anode. On the formed anode, a thin film comprising the light emitting material and the bis-condensed aromatic cyclic compound is formed as the light emitting layer. For forming the thin film of the light emitting material, for example, the spin coating process, the casting process or the vapor deposition process may be used. The vapor deposition process is preferable since formation of pin holes can be suppressed.

When the light emitting layer is formed in accordance with the vapor deposition process, in general, it is preferable that the conditions are suitably selected in the following ranges: the heating temperature of the boat: 50 to 400° C.; the vacuum: $10^{-5}$ to $10^{-3}$ Torr; the rate of deposition: 0.01 to 50 nm/second; the temperature of the substrate: −50 to +300° C. and the thickness of the film: 5 nm to 5 μm; although the conditions of the vacuum vapor deposition are different depending on the organic compound used for the light emitting layer and the crystal structure and the association structure of the molecular deposition film to be formed. After the light emitting layer is formed, a thin film made of a material for the cathode is formed on the light emitting layer, for example, in accordance with the sputtering process so that the thickness of the formed thin film is 1 μm or smaller and preferably in the range of 50 to 200 nm. The formed film is used as the cathode and the desired organic EL device is obtained. The organic EL device may also be produced by forming the layers in the reverse order, i.e., in the order of the cathode, the light emitting layer and the anode.

When the device has a structure in which a layer of a mixture of a hole injecting and transporting material, a light emitting material and an electron injecting material is disposed between a pair of electrodes as the light emitting layer, a thin film of an anode material is formed on a suitable substrate. On the formed anode, a solution comprising the hole injecting and transporting material, the light emitting material, the bis-condensed aromatic cyclic compound, the electron injecting material and a binder such as polyvinylcarbazole is applied to the anode so that a film coating the anode is formed. A film may also be formed from the above solution in accordance with the dipping coating process. The formed film is used as the light emitting layer. A thin film of a cathode material is then formed on the light emitting layer. As another process, the light emitting material and the bis-condensed aromatic cyclic compound may be vapor deposited on the light emitting layer formed above and a film of a cathode material may be formed on the resultant layer. As still another process, the light emitting layer may be formed by simultaneous vapor deposition of the hole injecting and transporting material, the electron injecting material, the light emitting material and the bis-condensed aromatic cyclic compound and a film of a cathode material may be formed on the resultant layer.

When the organic EL device has a structure of an anode/a hole injecting and transporting layer/a light emitting layer/a cathode, the anode is formed at first in accordance with the same procedure as that described above. A thin film of a hole transfer compound is formed as the hole injecting and transporting layer in accordance with the spin coating process so that the hole injecting and transporting layer is formed. The conditions in the formation of the hole injecting and transporting layer is the same as those in the formation of the thin film of the light emitting material described above. The light emitting layer and the cathode are formed successively on the hole injecting and transporting layer in accordance with the same procedures as those described above and the desired organic EL device is obtained. The organic EL device may also be produced by forming the layers in the reverse order, i.e., in the order of the cathode, the light emitting layer, the hole injecting and transporting layer and the anode.

When the organic EL device has a structure of an anode/a hole injecting and transporting layer/a light emitting layer/an electron injecting layer/a cathode, the anode, the hole injecting and transporting layer and the light emitting layer are formed successively in accordance with the same procedures as those described above. A thin film of an electron transfer compound is formed on the light emitting layer in accordance with the spin coating process so that the electron injecting layer is formed. The cathode is formed on the electron injecting layer in accordance with the same procedures as those described above and the desired organic EL device is obtained.

The above organic EL device may also be produced by forming the layers in the reverse order, i.e., in the order of the cathode, the electron injecting layer, the light emitting layer, the hole injecting and transporting layer and the anode.

The organic EL device of the present invention obtained as described above exhibits suppressed crystallization in driving for a long time and in environments at high temperatures and has improved durability.

The organic EL device which can be prepared as described above emits light at the side of the transparent or translucent electrode by applying a direct current voltage of 1 to 30 V in the condition that the anode is connected to a positive electrode (+) and the cathode is connected to a negative electrode (−). When the connection is reversed, no electric current is observed and no light is emitted at all. When an alternating voltage is applied to the organic EL device, light emission is observed only in the condition that the polarity of the anode is positive and the polarity of the cathode is negative. When an alternating voltage is applied to the organic EL device, any type of wave shape can be used.

The present invention will be described more specifically with reference to examples in the following. However, the present invention is not limited to the examples.

EXAMPLE 1

A glass substrate of a size of 25 mm×75 mm×1.1 mm having a transparent electrode of ITO (In—Sn—O) (manufactured by GEOMATEC Company) was cleaned in isopropyl alcohol by ultrasonic vibration for 5 minutes and then with ozone for 30 minutes under irradiation by ultraviolet light. The glass substrate having a transparent electrode which had been cleaned was attached to a substrate holder of a vacuum vapor deposition apparatus and cleaned with plasma under the atmosphere of a mixed gas of oxygen and argon. On the surface of the substrate at the side having the transparent electrode line, a film of N,N'-bis(N,N'-diphenyl-4-aminophenyl)-N,N-dinaphthyl-4,4'-diamino-1, 1'-biphenyl (a TPD233 film) having a thickness of 60 nm was formed. The formed TPD233 film worked as the first hole injecting layer (the hole transporting layer). On the formed TPD233 film, a film of 4,4'-bis[N-phenyl-N-(1-naphthyl)-4-aminophenyl]triphenylamine (a TPD78 film) having a thickness of 20 nm was formed. The formed TPD78 film worked as the second hole injecting layer (the hole transporting layer). On the formed TPD78 film, 9,10-di[4-(2,2'-diphenylvinyl-1-yl)phenyl]anthracene (DPVDPAN) and bisanthracene compound (6-1) as the bis-condensed aromatic cyclic compound were binary vapor deposited in amounts such that the ratio of the amounts by weight was 71:29 as the light emitting material. The formed film worked as the light emitting layer. When the light emitting layer was formed, 1,4-bis[2-(4-(N,N-di(3-methylphenyl)-amino)phenyl)vinyl]benzene (DMPAVB) as the fluorescent molecule based on styrylamine was added in an amount of 3% by weight based on the amount of the light emitting layer. On the formed light emitting layer, a film of tris(8-quinolinol)aluminum (an Alq film) having a thickness of 20 nm was formed. The Alq film worked as the electron injecting layer. On the formed Alq film, Li (the lithium source has been manufactured by SAES GETTERS Company) and Alq were binary vacuum vapor deposited and an Alq:Li film was formed as the electron injecting layer (the anode). On the formed Alq:Li film, metallic aluminum was vacuum vapor deposited and a metallic anode was formed. Thus, an organic EL device was prepared.

The properties of the prepared organic EL device were evaluated. When the anode of ITO was connected to the positive electrode (+) and the cathode of Al was connected to the negative electrode (−) and a direct current voltage of 7.05 V was applied, blue light was emitted at a luminance of 500 cd/m$^2$. The chromatic coordinates were (0.178, 0.300). When the device was sealed and driven under a constant current at an initial luminance of 500 cd/m$^2$ at a high temperature of 85° C., the change in the chromaticity was smaller than 0.01 after 200 hours. Thus, the chromaticity showed no change. The light emitting surface exhibited uniform light emission and the efficiency of light emission showed no decrease.

COMPARATIVE EXAMPLE 1

An organic EL device was prepared in accordance with the same procedures as those conducted in Example 1 except that bisanthracene compound (6-1) was not used.

The properties of the prepared organic EL device were evaluated. When the anode of ITO was connected to the positive electrode (+) and the cathode of Al was connected to the negative electrode (−) and a direct current voltage of 7.04 V was applied, blue light was emitted at a luminance of 500 cd/m$^2$. The chromatic coordinates were (0.198, 0.315) and the purity of color was excellent. When the device was sealed and driven under a constant current at an initial luminance of 500 cd/m$^2$ at a high temperature of 85° C., the change in the chromaticity was smaller than 0.01 after 200 hours. Thus, the chromaticity showed no change. However, a circular darker defect portion was formed on the light emitting surface. The defect portion was examined and it was found that crystals grew in this portion. It was estimated that the crystallization took place using defects or dusts in the substrate or the electrodes as the nuclei of crystallization.

EXAMPLE 2

An organic EL device was prepared in accordance with the same procedures as those conducted in Example 1 except that DPVDPAN as the light emitting material and bisanthracene compound (6-1) as the bis-condensed aromatic cyclic compound were binary vapor deposited in amounts such that the ratio of the amounts by weight was 49:51.

The properties of the prepared organic EL device were evaluated. When the anode of ITO was connected to the positive electrode (+) and the cathode of Al was connected to the negative electrode (−) and a direct current voltage of 6.78 V was applied, blue light was emitted at a luminance of 500 cd/m$^2$. The chromatic coordinates were (0.180, 0.290). When the device was sealed and driven under a constant current at an initial luminance of 500 cd/m$^2$ at a high temperature of 85° C., the change in the chromaticity was smaller than 0.01 after 200 hours. Thus, the chromaticity showed no change. The light emitting surface exhibited uniform light emission and the efficiency of light emission showed no decrease.

EXAMPLE 3

An organic EL device was prepared in accordance with the same procedures as those conducted in Example 1 except that DPVDPAN as the light emitting material and bisanthracene compound (4-1) as the bis-condensed aromatic cyclic compound were binary vapor deposited in amounts such that the ratio of the amounts by weight was 49:51.

The properties of the prepared organic EL device were evaluated. When the anode of ITO was connected to the positive electrode (+) and the cathode of Al was connected to the negative electrode (−) and a direct current voltage of 6.87 V was applied, blue light was emitted at a luminance of 500 cd/m$^2$. The chromatic coordinates were (0.180, 0.318). When the device was sealed and driven under a constant current at an initial luminance of 500 cd/m$^2$ at a high temperature of 85° C., the change in the chromaticity was smaller than 0.01 after 200 hours. Thus, the chromaticity showed no change. The light emitting surface exhibited uniform light emission and the efficiency of light emission showed no decrease.

EXAMPLE 4

An organic EL device was prepared in accordance with the same procedures as those conducted in Example 1 except that DPVDPAN as the light emitting material and bisanthracene compound (6-8) as the bis-condensed aromatic cyclic compound were binary vapor deposited in amounts such that the ratio of the amounts by weight was 90:10 and DMPAVB as the fluorescent molecule was not added.

The properties of the prepared organic EL device were evaluated. When the anode of ITO was connected to the positive electrode (+) and the cathode of Al was connected to the negative electrode (−) and a direct current voltage of 6.52 V was applied, blue light was emitted at a luminance of 225 cd/m². The chromatic coordinates were (0.152, 0.153). When the device was sealed and driven under a constant current at an initial luminance of 500 cd/m² at a high temperature of 85° C., the change in the chromaticity was smaller than 0.02 after 200 hours. Thus, the chromaticity showed no change. The light emitting surface exhibited uniform light emission and the efficiency of light emission showed no decrease.

In Examples 1 to 3 and Comparative Example 1, when the organic EL devices were driven under a constant current at an initial luminance of 500 cd/m² at a high temperature of 85° C., the half-life was 500 hours or longer. This value corresponds to 8,000 hours or longer when the devices were driven at the room temperature and the devices had the property sufficient for practical applications. Therefore, the bis-condensed aromatic cyclic compound showed no influence on the life of the organic EL devices.

In Example 4, when the organic EL device was driven under a constant current at an initial luminance of 500 cd/M² at a high temperature of 85° C., the half-life was 300 hours or longer. This value corresponds to 8,000 hours or longer when the device was driven at the room temperature at an initial luminance of 200 cd/m². Therefore, the crystallization was suppressed and uniform light emission was maintained.

Industrial Applicability

In accordance with the present invention, the organic EL device which exhibits suppressed crystallization in driving for a long time or in environments at high temperatures, shows no change in the color of emitted light in use at high temperatures, has improved durability in that a uniform light emission is maintained and is advantageously used in practical applications can be obtained. The properties of the organic EL device such as the efficiency of light emission and the life are not adversely affected.

The organic EL device of the present invention can be advantageously used, for example, for displays of information instruments.

What is claimed is:

1. In an organic electroluminescence device comprising a pair of electrodes comprising an anode and a cathode and a layer of organic compounds comprising at least an organic light emitting layer and disposed between the pair of electrodes, wherein the layer of organic compounds comprises a light emitting material compound represented by the following general formula (1):

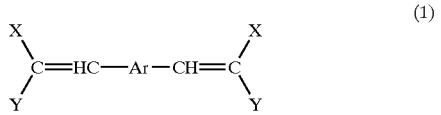

(1)

wherein X and Y each independently represent a substituted or unsubstituted aryl group having 6 to 50 carbon atoms or a substituted or unsubstituted monovalent heterocyclic group having 3 to 50 carbon atoms and may represent the same group or different groups and Ar represents an arylene group having 6 to 80 carbon atoms, a polyarylene group, a divalent triphenylamine residue group, a divalent heterocyclic group having 3 to 80 carbon atoms or a divalent group formed by bonding said groups to each other, the improvement being that the layer of organic compounds contains a substance for suppressing crystallization that is a bis-condensed aromatic cyclic compound represented by following general formula (2):

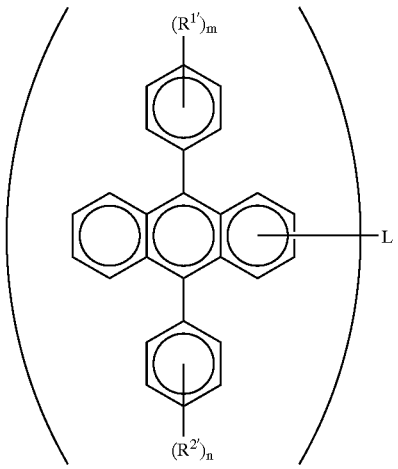

(2)

wherein $R^{1'}$ and $R^{2'}$ each independently represent a substituted or unsubstituted alkyl group having 1 to 30 carbon atoms, a substituted or unsubstituted cycloalkyl group having 5 to 30 carbon atoms, a substituted or unsubstituted aryl group having 6 to 30 carbon atoms, a substituted or unsubstituted alkenyl group having 3 to 30 carbon atoms, a substituted or unsubstituted alkoxyl group having 1 to 30 carbon atoms, a substituted or unsubstituted aryloxyl group having 6 to 30 carbon atoms, a substituted or unsubstituted amino group or a substituted or unsubstituted heterocyclic group having 2 to 30 carbon atoms and may represent the same group or different groups;

n and m each represent an integer of 0 to 5, when n represents an integer of 2 or greater, a plurality of $R^{1'}$ may represent the same group or different groups and may be bonded to each other to form a cyclic structure and, when m represents an integer of 2 or greater, a plurality of $R^{2'}$ may represent the same group or different groups and may be bonded to each other to form a cyclic structure; and L represents a single bond, a substituted or unsubstituted arylene group having 6 to 30 carbon atoms, a substituted or unsubstituted alkylene group having 1 to 30 carbon atoms, —O—, —S— or —NR—, R representing a substituted or unsubstituted alkyl group having 1 to 30 carbon atoms or a substituted or unsubstituted aryl group having 6 to 30 carbon atoms, that does not cause crystallization and/or development of dark spots to occur at 85° C. for at least 200 hours during driving of the device, where an energy gap of the compound represented by general formula (2) is greater than an energy gap of the compound represented by general formula (1).

2. An organic electroluminescence device according to claim 1, wherein the organic light emitting layer comprises a light emitting material and a bis-condensed aromatic cyclic compound.

3. An organic electroluminescence device according to claim 1, wherein the organic light emitting layer has a thickness of 5 nm to 0.5 μm.

4. In an organic electroluminescence device comprising a pair of electrodes comprising an anode and a cathode and a layer of organic compounds comprising at least an organic light emitting layer and disposed between the pair of electrodes, wherein the layer of organic compounds comprises a light emitting material compound represented by the following general formula (1):

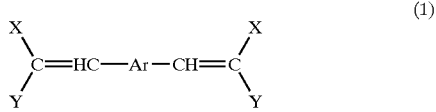

(1)

wherein X and Y each independently represent a substituted or unsubstituted aryl group having 6 to 50 carbon atoms or a substituted or unsubstituted monovalent heterocyclic group having 3 to 50 carbon atoms and may represent the same group or different groups and Ar represents an arylene group having 6 to 80 carbon atoms, a polyarylene group, a divalent triphenylamine residue group, a divalent heterocyclic group having 3 to 80 carbon atoms or a divalent group formed by bonding said groups to each other, the improvement being that the layer of organic compounds contains a substance for suppressing crystallization that is a bis-condensed aromatic cyclic compound represented by following general formula (3):

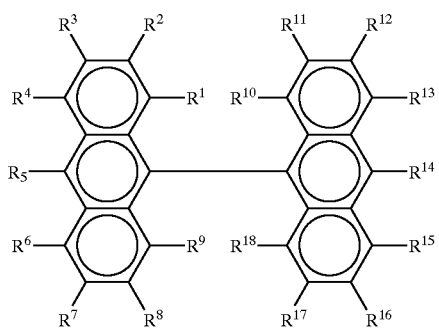

(3)

wherein $R^1$ to $R^{18}$ each independently represent hydrogen atom, a halogen atom, hydroxy group, a substituted or unsubstituted amino group, nitro group, cyano group, a substituted or unsubstituted alkyl group having 1 to 30 carbon atoms, a substituted or unsubstituted cycloalkyl group having 5 to 30 carbon atoms, a substituted or unsubstituted alkenyl group having 3 to 30 carbon atoms, a substituted or unsubstituted alkoxyl group having 1 to 30 carbon atoms, a substituted or unsubstituted aromatic hydrocarbon group having 6 to 30 carbon atoms, a substituted or unsubstituted aromatic heterocyclic group having 2 to 30 carbon atoms, a substituted or unsubstituted aralkyl group having 7 to 30 carbon atoms, a substituted or unsubstituted aryloxyl group having 6 to 30 carbon atoms, or a substituted or unsubstituted alkoxycarbonyl group having 1 to 30 carbon atoms or carboxyl group, that does not cause crystallization and/or development of dark spots to occur at 85° C. for at least 200 hours during driving of the device, where an energy gap of the compound represented by general formula (3) is greater than an energy gap of the compound represented by general formula (1).

5. An organic electroluminescence device according to claim 4, wherein the organic light emitting layer comprises a light emitting material and a bis-condensed aromatic cyclic compound.

6. An organic electroluminescence device according to claim 4, wherein the organic light emitting layer has a thickness of 5 nm to 0.5 μm.

* * * * *